(12) United States Patent (10) Patent No.: US 12,577,663 B2
Durand et al. (45) Date of Patent: Mar. 17, 2026

(54) AMPOULE FOR A SEMICONDUCTOR MANUFACTURING PRECURSOR

(71) Applicant: Applied Materials, Inc., Santa Clara, CA (US)

(72) Inventors: William J. Durand, Oakland, CA (US); Kenric Choi, San Jose, CA (US); Garry K. Kwong, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 546 days.

(21) Appl. No.: 17/360,337

(22) Filed: Jun. 28, 2021

(65) Prior Publication Data

US 2022/0411924 A1 Dec. 29, 2022

(51) Int. Cl.
*C23C 16/448* (2006.01)
*C23C 16/455* (2006.01)

(52) U.S. Cl.
CPC .... *C23C 16/4481* (2013.01); *C23C 16/45561* (2013.01)

(58) Field of Classification Search
CPC ...................... C23C 16/4481; C23C 16/45561
See application file for complete search history.

(56) References Cited

U.S. PATENT DOCUMENTS 5,558,687 A * 9/1996 Cain .................. C23C 16/4483
261/153
7,122,085 B2 10/2006 Shero et al.

7,186,385 B2 * 3/2007 Ganguli .............. C23C 16/4482
392/389
7,464,917 B2 * 12/2008 Lee ..................... C23C 16/4482
261/DIG. 65
7,524,374 B2 * 4/2009 Chen .................. C23C 16/4481
118/716
7,547,363 B2 * 6/2009 Tomiyasu ........... C23C 16/4481
118/726

(Continued)

FOREIGN PATENT DOCUMENTS

CN 101905126 B * 1/2013 ......... C23C 16/4481
JP 2005033045 A 2/2005

(Continued)

OTHER PUBLICATIONS

PCT International Search Report and Written Opinion in PCT/US2022/033187 dated Sep. 28, 2022, 10 pages.

*Primary Examiner* — Jeffrie R Lund
(74) *Attorney, Agent, or Firm* — Servilla Whitney LLC

(57) ABSTRACT

Ampoules for a semiconductor manufacturing precursors and methods of use are described. The ampoules include a container with an inlet port and an outlet port. Alternating first and second elongate walls in the container are arranged to define longitudinal flow channels containing a precursor material, and alternating first and second passages between each of the longitudinal flow channels permitting fluid communication between adjacent longitudinal flow channels, wherein the first passages are located in a lower portion of the precursor cavity and the second passages are located an upper portion of the cavity. A flow path is defined by the longitudinal flow channels and the passages, through which a carrier gas flows in contact with the precursor material. In one or more embodiments, the precursor material is a solid.

13 Claims, 3 Drawing Sheets

(56) References Cited

U.S. PATENT DOCUMENTS

| | | | | |
|---|---|---|---|---|
| 7,775,508 B2 * | 8/2010 | Choi | ................... | C23C 16/4481 |
| | | | | 261/142 |
| 8,137,462 B2 | 3/2012 | Fondurulia et al. | | |
| 8,309,173 B2 | 11/2012 | Tuominen et al. | | |
| 8,986,456 B2 | 3/2015 | Fondurulia et al. | | |
| 9,004,462 B2 | 4/2015 | Gregg et al. | | |
| 9,469,898 B2 | 10/2016 | Gregg et al. | | |
| 9,593,416 B2 | 3/2017 | Fondurulia et al. | | |
| 10,392,700 B2 | 8/2019 | Baum et al. | | |
| 10,465,286 B2 | 11/2019 | Gregg et al. | | |
| 10,526,697 B2 | 1/2020 | Baum et al. | | |
| 11,180,849 B2 * | 11/2021 | Herle | ...................... | C23C 16/50 |
| 11,773,485 B2 * | 10/2023 | Marquardt | .......... | C23C 16/4481 |
| | | | | 118/726 |
| 12,037,684 B2 * | 7/2024 | Cardozo | ............... | C23C 16/448 |
| 12,129,545 B2 * | 10/2024 | Zhu | ......................... | B01D 1/14 |
| 2004/0013577 A1 * | 1/2004 | Ganguli | ............. | C23C 16/4481 |
| | | | | 422/129 |
| 2004/0014320 A1 * | 1/2004 | Chen | ................... | C23C 16/4402 |
| | | | | 438/692 |
| 2006/0185597 A1 * | 8/2006 | Suzuki | ................ | C23C 16/4481 |
| | | | | 118/726 |
| 2008/0099933 A1 * | 5/2008 | Choi | ................... | C23C 16/4481 |
| | | | | 261/127 |
| 2008/0149031 A1 * | 6/2008 | Chu | ................... | C23C 16/4482 |
| | | | | 118/726 |
| 2009/0232986 A1 * | 9/2009 | Choi | ................ | C23C 16/45561 |
| | | | | 118/724 |
| 2010/0119734 A1 * | 5/2010 | Choi | ................... | C23C 16/4481 |
| | | | | 118/724 |
| 2018/0094351 A1 | 4/2018 | Verghese et al. | | |
| 2020/0056283 A1 | 2/2020 | Shero et al. | | |
| 2020/0340109 A1 | 10/2020 | Verghese et al. | | |
| 2022/0178020 A1 * | 6/2022 | White | .............. | H01L 21/67017 |
| 2022/0411924 A1 * | 12/2022 | Durand | ............ | C23C 16/45561 |
| 2024/0209501 A1 * | 6/2024 | Verghese | ........... | C23C 16/4481 |

FOREIGN PATENT DOCUMENTS

| | | | | | |
|---|---|---|---|---|---|
| JP | 2005033146 A | | 2/2005 | | |
| KR | 20150122659 A | * | 11/2015 | | |
| KR | 101755033 B1 | | 7/2017 | | |
| TW | 201739665 A | * | 11/2017 | ............ | B65D 45/02 |
| WO | 2007044208 A2 | | 4/2007 | | |

* cited by examiner

AMPOULE FOR A SEMICONDUCTOR MANUFACTURING PRECURSOR

TECHNICAL FIELD

The present disclosure relates generally to ampoules for and methods using semiconductor manufacturing precursors. In particular, the disclosure relates to ampoules and methods to provide a tortuous flow path for precursor materials, for example solid precursor materials.

BACKGROUND

The semiconductor industry is using an increasing variety of chemistries for chemical vapor deposition (CVD) and atomic layer deposition (ALD) processes that come in liquid or solid form. The precursor is typically inside a closed vessel or ampoule with a single inlet and a single outlet.

Solid chemical precursors are transported (i.e. delivered) from a vessel (ampoule) to a reactor for deposition/etch processes. Typically, solid materials have low vapor pressures, precluding the use of mass flow controllers and other delivery mechanisms and necessitating a carrier gas to sweep material out of the ampoule. Precursors with a low vapor pressure frequently use a carrier gas to carry vaporized or sublimed precursor out of the ampoule to a process reactor. Standard ampoule designs, however, do not generally result in a carrier gas saturated with volatilized or sublimed material. These sub-saturated carrier streams have historically been enhanced using two methods: decreasing size of a slowly diffusing boundary layer using high-velocity jets, or increasing residence time between gas and solid by flowing gas over trays filled with solid.

Reaction rates at the wafer are dependent on the vapor phase concentration, thus it is desirable to enhance the transport kinetics to improve process conditions.

Generally, there is a need in the art for ampoules and methods of making and using, where the ampoule has an adequate flow path to saturate or nearly saturate the carrier gas with the precursor and provide consistent delivery of the precursor. There is also a continuing need to improve process conditions. In particular, there is a need to improve delivery of precursors for on-wafer high aspect ratio structures, which rely on high concentrations of the precursors for conformal processes.

SUMMARY

One or more embodiments are directed to an ampoule for semiconductor manufacturing precursors. The ampoule comprises a container defining a cavity configured to hold the precursor. An inlet port and an outlet port are both in fluid communication with the cavity. Alternating first and second elongate walls are arranged to define a series of longitudinal flow channels containing the precursor material, and alternating first and second passages between each of the longitudinal flow channels permitting fluid communication between adjacent longitudinal flow channels, wherein the first passages are located in a lower portion of the precursor cavity and the second passages are located an upper portion of the cavity. A flow path is defined by the longitudinal flow channels and the passages, through which a carrier gas flows in contact with the precursor material.

Additional embodiments of the disclosure are directed to an ampoule for dispensing a vapor mixture of a carrier gas and a precursor used in semiconductor manufacturing. The ampoule comprises a container having a bottom wall, sidewalls, and a lid, the container defining a cavity configured to hold the precursor, such that a height (H) of the cavity spans from a lower surface of the lid to a top surface of the bottom wall. A single inlet port and a single outlet port are both in fluid communication with the cavity. The ampoule includes: alternating first and second elongate walls arranged to define a series of longitudinal flow channels containing the precursor material, and alternating first and second passages between each of the longitudinal flow channels permitting fluid communication between adjacent longitudinal flow channels, wherein the first passages are located in a lower portion of the precursor cavity, and the second passages are located in an upper portion of the precursor cavity, and the first passages do not overlap with any of the second passages. A tortuous flow path is defined by the longitudinal flow channels and the passages, through which a carrier gas flows in contact with the precursor material.

Further embodiments of the disclosure are directed to methods of providing a flow of precursor. A carrier gas flows through an inlet port of an ampoule having a precursor material therein. A flow of the carrier gas within the ampoule and in contact with the precursor material is directed through a series of longitudinal flow channels defined by alternating first and second elongate walls and alternating first and second passages between each of the longitudinal flow channels permitting fluid communication between adjacent longitudinal flow channels, through which the carrier gas flows in contact with the precursor material, wherein the first passages are located in a lower portion of the precursor cavity, and the second elongate passages are located in an upper portion of the cavity. The carrier gas and precursor flow out of the ampoule through an outlet port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
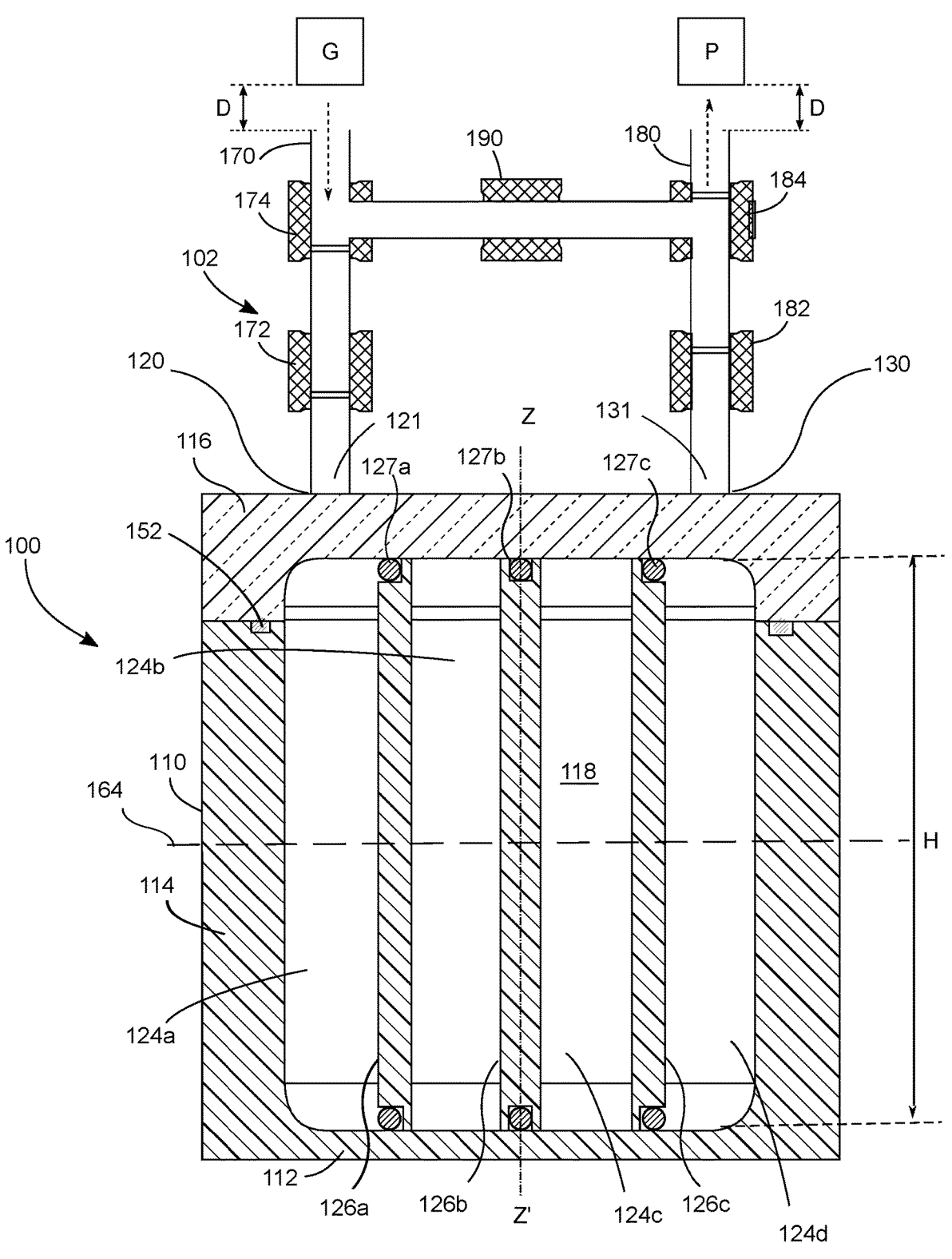
FIG. 1 shows a cross-section view of an ampoule and accompanying manifold having an "outer-to-outer flow" configuration in accordance with an embodiment.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As new materials are investigated for semiconductor processes, demand increases for new chemical precursors, many of which have reduced volatility, often being solids. Low vapor pressure, e.g., solid, precursors are susceptible to poor conformality on high surface area 3D structures due to lower vapor concentration being delivered. Concentration can usually be increased by increasing ampoule temperature, but many precursors have maximum temperature limits due to thermal decomposition.

Transport of low vapor pressure precursors, for example, solid materials, into a delivery stream for a process reactor is dependent on the residence time between a carrier gas and the solid. A saturated delivery stream promotes process stability, and its higher concentrations is better for reactions at a wafer surface. An ampoule designed with vertical walls or baffles, e.g., structures that span longitudinally in the ampoule, forces the carrier gas through a void space of granulated or pelletized solid, promoting turbulence, mixing, and diffusion as the carrier gas takes a tortuous path through channels of the ampoule defined by the baffles. Advantageously, designs herein facilitate disruption to the gas/solid interface by forcing gas through a bed of granulated solid to maximize residence time. Advantageously, designs herein also facilitate easier refill. Some embodiments of the disclosure advantageously provide a tortuous flow path for a carrier gas from ampoule inlet to outlet for the delivery of the precursors.

A flow path having a tortuous flow path, that is a path that includes changes in flow direction, allows the carrier gas adequate residence time to become partially to nearly to fully saturated with vaporized and/or sublimed and/or entrained precursor. Reference herein to "saturated" allows for varying degrees of saturation.

Low vapor pressure precursors are understood to refer to materials that do not readily vaporize under atmospheric conditions. Low vapor pressure precursors typically have a vapor pressure of less than 10 Torr, and more typically less than 1 Torr. In some applications, a carrier gas is used to deliver low vapor pressure material from an ampoule to a reactor. Low vapor pressure materials typically require heat to increase the vapor pressure. "Metal chlorides" and/or "metal-organic precursors" are examples of such low pressure materials.

In one or more embodiments, designs are for ampoule volumes in a range of 1.2 L to 4 L, and all values and subranges therebetween.

Further advantages of the ampoules herein include the ability to enhance concentration of solid materials without significantly impacting geometry of standard ampoules. Higher concentrations can be used to widen process windows and improve dep/etch performance for high aspect ratio structures. Further, these designs allow for bulk-scale delivery of precursors. In addition, granulated solid can be easily added to this design with an open top lid, which is not typically possible with powdered or sintered solids. Unlike cross-flow type ampoule designs where a carrier gas follows a path of least resistance, the designs herein force the carrier gas through a tortuous path and changes of direction throughout the ampoule. The carrier gas percolates through void space between solid pellets, evaporating material from surfaces on all sides. By forcing gas through a bed of the solid precursor, the slowly diffusing stagnant layers are disrupted and the residence time of the carrier gas inside the ampoule is prolonged, increasing delivered concentrations.

In one or more embodiments, solid chemical precursors are preferentially sieved to obtain and/or form larger granules or pellets, which are packed into an ampoule, e.g., a steel ampoule. A carrier gas is forced through a bed of the granules or pellets. Material evaporating from the solid surfaces is picked up by the carrier gas stream and carried out of the ampoule to a process reactor. The resulting concentration in the carrier gas will be dependent on the residence time across the solids, the size of the boundary layers surrounding the granules, and the surface area the gas has to interact with.

Walls and/or baffles are inserted into an ampoule to direct flow through the bed of granules and a headspace of the container. Additional baffles can be added to increase the number of sub-compartments where diffusion and headspace mixing occur, increasing the degree of saturation as the gas passes towards the ampoule outlet. In one or more embodiments, walls and/or baffles isolate each sub-compartment using sealing o-rings to direct gas flow. Walls and passages are used to direct flow. In one or more embodiments, walls are positioned in the container to form flow channels, and a passage where there's no wall allows fluid communication among the flow channels. In one or more embodiments, baffles comprise both the wall and the passage. For example, baffles may comprise a baffle wall, which is an impermeable body of material, e.g., steel, and one or more openings defined therein to direct gas flow. Positioning of the passages and the walls, and similarly, the holes in the baffle walls, is such that flow is alternatingly forced towards a bottom end of the ampoule then towards a top end of the ampoule until an outlet port of the ampoule is reached.

Generally, ampoules comprise: a container defining a precursor cavity configured to hold a precursor material; and an inlet port and an outlet port, both in fluid communication with precursor the cavity. Alternating first and second elongate baffles are arranged to define a series of longitudinal flow channels containing the precursor material, and alternating first and second passages between each of the longitudinal flow channels permitting fluid communication between adjacent longitudinal flow channels, wherein the first passages are located in a lower portion of the precursor cavity and the second passages are located an upper portion of the cavity. A flow path is defined by the longitudinal flow channels and the passages, through which a carrier gas flows in contact with the precursor material.

In one or more embodiments, an ampoule comprises: a container having a bottom wall, sidewalls, and a lid, the container defining a precursor cavity configured to hold a solid precursor, such that a height (H) of the precursor cavity spans from a bottom surface of the lid to a top surface of the bottom wall; and a single inlet port and a single outlet port, both in fluid communication with the precursor cavity. Alternating first and second elongate walls are arranged to define a series of longitudinal flow channels containing the precursor material, and alternating first and second passages between each of the longitudinal flow channels permitting fluid communication between adjacent longitudinal flow channels, wherein the first passages are located in a lower portion of the precursor cavity, and the second passages are located in an upper portion of the precursor cavity, and the first passages do not overlap with any of the second passages. A tortuous flow path is defined by the longitudinal flow channels and the passages, through which a carrier gas flows in contact with the precursor material.

In one or more embodiments, the flow path travels from a first outer channel in communication with the inlet port to a second outer channel in communication with the outlet port, which may be referred to as an "outer-to-outer flow" configuration. In one or more embodiments, the flow path travels from an inner channel in communication with the inlet port to one or more outer channels in communication with the outlet port, which may be referred to as an "inner-to-outer flow" configuration.

The container may have any suitable shape to accommodate solid precursor, walls and/or baffles, and process application. In one or more embodiments, the shape of the container is selected from: a cylinder, a rectangular prism, a cuboid, and a cube.

Generally, the flow paths provided herein force carrier gas to alternating flow towards the bottom of the ampoule and back towards the top of the ampoule through elongate baffles whose openings do not overlap. First and second elongate walls define longitudinal flow channels, each containing a volume of solid precursor. The gas flow changes direction from flow channel to flow channel until the last flow channel in communication with the outlet port is reached. This change of direction also enhances mixing of the vaporized and/or sublimed precursor with the carrier gas. Passages and/or openings in baffles allow the carrier gas to flow through into the next flow channel. Reference herein to gas flow includes the carrier gas alone or in combination with entrained and/or vaporized and/or sublimed precursor.

FIG. 1 shows a cross-section view of an ampoule and accompanying manifold having an "outer-to-outer flow" configuration in accordance with an embodiment. An ampoule 100 and a manifold 102 are suitable for use with semiconductor manufacturing raw materials, which include reagents and precursors. The term "precursor" is used to describe the contents of the ampoule 100 and refers to any reagent that flows into a process environment.

The ampoule 100 includes a container 110 with a bottom wall 112, sidewalls 114, and a lid 116. An inlet port 120 and outlet port 130 are in fluid communication with a precursor cavity defined by internal walls of the container 110. In one or more embodiments, the ampoule 100 comprises a single inlet port 120 and a single outlet port 130. The inlet port 120 is generally configured to allow a connection to a gas source "G" by way of suitable piping and valve(s) and may have suitable threaded or sealing connections. In one or more embodiments, the gas source "G" is a carrier gas; in one or more embodiments, the carrier gas is inert. The outlet port 130 is also in fluid communication with the cavity. The outlet port 130 is generally configured to be able to connect to a line, including suitable piping and valve(s), to allow the flow of gases, which may include entrained particles, exiting the container 110 to flow to a processing chamber (or other component) "P". The outlet port 130 may have a welded or threaded connection to allow a gas line to be connected.

In one or more embodiments, the ampoule comprises a single inlet and a single outlet. While the embodiment of FIG. 1 depicts one of each an inlet and an outlet port, should a particular application require, multiple inlet ports and outlet ports may be present. Positioning of the inlet and outlet ports may be switched to accommodate other designs.

In one or more embodiments, the inlet port 120, the outlet port 130, or both the inlet port 120 and the outlet port 130 extend through the lid 116. In one or more embodiments, the inlet port 120, the outlet port 130, or both the inlet port 120 and the outlet port 130 extend through the side wall 114. In one or more embodiments, the inlet port 120 extends through the lid 116, and the outlet port 130 extends through the sidewall 114. In one or more embodiments, the inlet port 120 extends through the sidewall 114, and the outlet port 130 extends through the lid 116.

A height (H) of the cavity defined by the container 110 spans from a lower surface of the lid 116 to a top surface of the bottom wall 112. The cavity 118 has a centerline 164, located at the midway point of the height "H".

The inlet port 120 has a passage 121 with an inner diameter defining a cross-sectional width of the passage 121, the inlet port 120 extends through the lid 116. The passage 121 routes a volume of incoming carrier gas from a source "G" into a precursor cavity, which is generally shown as 118. In one or more embodiments, a solid precursor is disposed within the precursor cavity 118. In one or more embodiments, the solid precursor is in granular or pellet form.

The outlet port 130 has a passage 131 with an inner diameter defining a cross-sectional width of the passage 131, the outlet port 130 extends through the lid 116. The passage 131 routes a volume of outgoing entrained and/or saturated carrier gas out of the ampoule to a downstream process chamber "P".

With specific regard to this embodiment, within the cavity 118 are a plurality of longitudinal flow channels 124a-124d defined by a plurality of elongate baffles 126a-126c. The elongate baffles 126a-126c each comprise one or more openings (not seen in this view).

The inlet port 120 (and its passage 121) is in fluid communication with a first outer channel 124a, and the outlet port 130 (and its passage 131) is in fluid communication with a second outer channel 124d. Channels 124b and 124c are inner channels.

In some embodiments, as shown in FIG. 1, the lid 116 is a separate component from the bottom wall 112 and sidewalls 114. The lid 116 can be connected to the sidewalls 114 of the container 110 using removable bolts through appropriately shaped openings, which may have a threaded portion to allow for easy connection of a threaded bolt. The bolts can be removed to allow the lid 116 to be removed from the container 110 so that the precursor 150 in the container 110 can be changed or added. A first seal 152 is located between an upper surface of the sidewalls 114 and the lower surface of the lid 116 to form a fluid tight seal. In one or more embodiments, the first seal 152 is an o-ring. In one or more embodiments, the first seal 152 is a metal gasket.

The lid may further comprise one or more external surface features to reciprocate with an external heater. The bottom wall may be configured to reciprocate with an external heater. One or more jacket heaters may be provided around the sidewalls.

The plurality of elongate baffles 126a-126c at a bottom edge or rim reside in or mate within a top surface of the bottom wall 112. In this embodiment, respective seals 127a-127c, e.g. o-rings provide fluid-tight separation around a circumference of each baffle and the bottom wall 112 and sidewalls 114 and a bottom surface of the lid 116. In this way, flow is forced though the openings of the baffles between the longitudinal flow channels. In one or more embodiments, the elongate baffles are effective to conduct heat from one or more external sources.

The elongate baffles 126a-126c may be positioned, secured, or otherwise attached within the container 110 by any suitable techniques. In one or more embodiments, the elongate baffles 126a-126c are independently fastened to each other and inside surfaces of the container with fasteners.

Depending on the design, optionally a second seal is located between an upper portion of the bottom wall 112 and a lower surface of the sidewalls 114 to form a fluid tight seal. In some embodiments, the first seal 152 and the second seal are independently an O-ring or a metal gasket.

In some embodiments (not shown), the lid 116 can be integrally formed with the sidewalls 114 and the bottom wall 112 of the container 110.

Different manifold configurations can be connected to the lid 116 to allow the ampoule 100 to be added to a process chamber. In some embodiments, an inlet line 170 is connected to the inlet port 120. An inlet valve 172 can be positioned on the inlet line 170 between gas source "G" and the inlet port 120. The inlet valve 172 can be integrally formed with the lid 116 or connected to the lid 116 as a separate component. An outlet line 180 can be connected to the outlet port 130. The outlet line 180 of some embodiments includes an outlet valve 182 located between the outlet port 130 and the processing chamber "P". The inlet valve 172 and outlet valve 182 can be used to isolate the ampoule 100 so that the contents of the cavity 118 are isolated from the environment outside of the container 110. In some embodiments, there are multiple valves along the inlet line 170 (e.g., 174) and/or the outlet line 180 (e.g., 184) and/or therebetween (e.g., 190). The valves can be manual valves or pneumatic valves.

Figure 2:
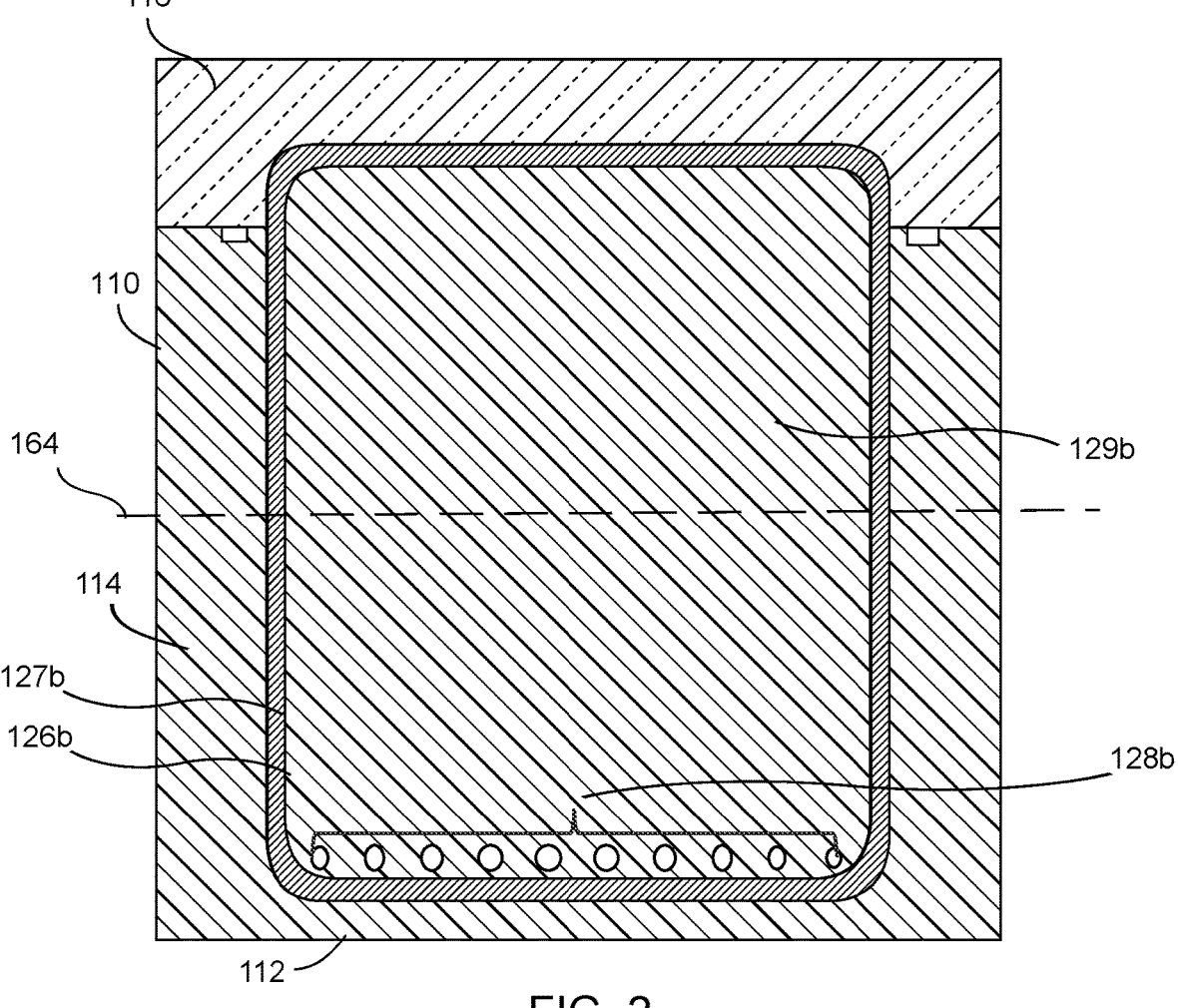
FIG. 2 shows an excerpted cross-sectional view along line Z-Z' of FIG. 1 of the container only in accordance with one or more embodiments.

Turning to FIG. 2, which is an excerpted cross-sectional view along line Z-Z' of FIG. 1 of the container 110 only. The baffle 126*b* comprises a plurality of openings 128*b* (e.g., one or more) in a baffle wall 129*b*. The baffle 126*b* creates longitudinal flow channels. There is a seal 127*b*, e.g., o-ring, between the baffle wall 129*b* and the lid 116, the sidewalls 114, and the bottom wall 112. Openings 128*b* of the baffle wall 129*b* are off-set with openings of adjacent baffles that no openings of a first configuration of baffles overlaps with openings of a second configuration of baffles and that no flow channels are bypassed. The baffles may be secured, e.g., welded, to internal surfaces of the container. The baffles may be configured with holes to accommodate fasteners, e.g., bolts, to secure adjacent baffles upon assembly of the ampoule.

The openings are shaped and sized based on desired applications. In one or more embodiments, the openings are circular. In one or more embodiments, there are a range of one to ten openings in a baffle wall. In one or more embodiments, the openings are a plurality of holes on each baffle wall spaced apart along a width of each wall. In one or more embodiments, an opening spans an axial width of the baffle wall. In one or more embodiments, the opening spanning the axial width of the baffle wall spans a distance of less than 100% to greater than or equal to 1%, and all values and subranges therebetween.

The baffle 126*b* comprises a first configuration, which locates the one or more openings 128*b* in a lower portion of the baffle wall 129*b*. That is, with respect to a longitudinal centerline 164 of the baffle 126*b*, the openings 128*b* are at the midpoint or below, closer to the bottom wall 112. In one or more embodiments, the openings of the baffles of the first configuration are positioned within the bottom 25%, or 20%, or 15%, or 10%, or 5%, or 1% of the longitudinal distance of the baffle from a top surface of the bottom wall 112.

A second configuration of baffles that are adjacent to baffles of the first configuration locates the one or more openings in an upper portion of the baffle wall (not shown in FIG. 2). That is, with respect to a longitudinal centerline of second baffles (e.g., 126*a* and 126*c* of FIG. 1), respective openings 128*a* and 128*c* would be at the centerline or above, closer to the lid 116. In one or more embodiments, the openings of the baffles of the second configuration are positioned within the top 25%, or 20%, or 15%, or 10%, or 5%, or 1% of the longitudinal distance of the baffle from a bottom surface of the lid 116.

The openings of the first and second configurations are off-set. If openings of one of the configurations are positioned at the centerline, then openings of the other configuration would not be positioned at the centerline.

Figure 3:
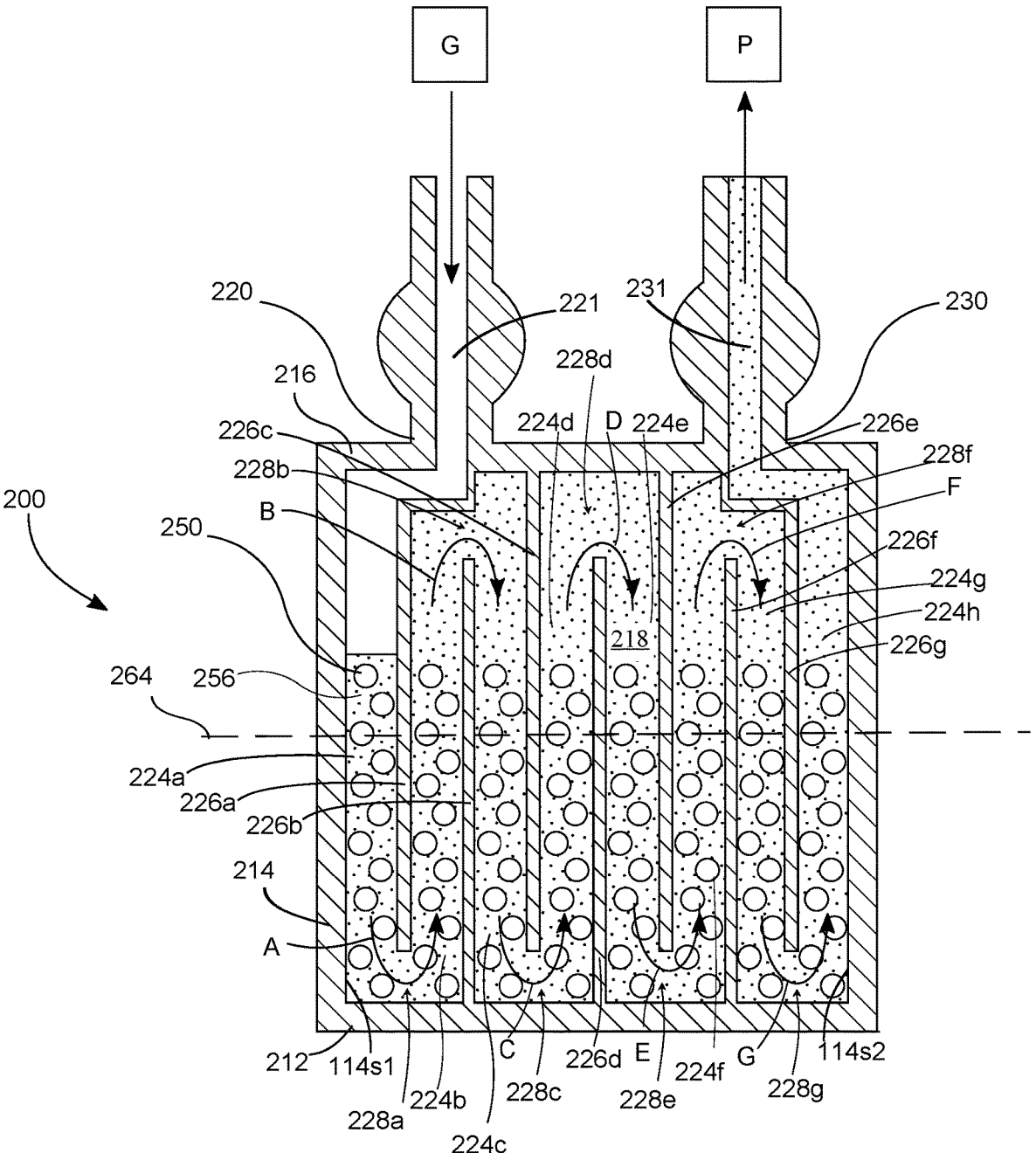
FIG. 3 shows a schematic cross-section view of an ampoule containing solid precursor material in accordance with one or more embodiments.

FIG. 3 shows a schematic cross-section view of an ampoule 200 containing solid precursor material 250 according to one or more embodiments. The solid precursor material 250 is in a bed and there is void space 256 among granules or pellets of the solid precursor material 250. The flow path of carrier gas "G" through longitudinal flow channels 224*a*, 224*b*, 224*c*, 224*d*, 224*e*, 224*f*, 224*g*, 224*h* is shown by the arrows A, B, C, D, E, F, and G. In this embodiment, there are four elongate walls 226*a*, 226*c*, 226*e*, 226*g* of a first configuration in that the walls attach directly or indirectly to the lid 216, and a series of respective first passages 228*a*, 228*c*, 228*e*, and 228*g* are below a centerline 264 of the cavity 218. The first passages 228*a*, 228*c*, 228*e*, and 228*g* are defined by an end of the respective elongate wall 226*a*, 226*c*, 226*e*, 226*g* and a respective portions of a top surface of the bottom wall 212. Also in this embodiment, there are three elongate walls 226*b*, 226*d*, 226*f* of a second configuration in that the walls attach directly or indirectly to the bottom wall 212, and a series of respective second passages 228*b*, 228*d*, and 228*f* are above centerline 264 of cavity 218, which is located at the midway point of a height of the cavity defined by a lower surface of the lid 216 and an top surface of the bottom wall 212. The second passages 228*b*, 228*d*, and 228*f* are defined by an end of the respective elongate wall 226*b*, 226*d*, 226*f* and respective portions of a bottom surface of the lid wall 216. The first passages are off-set with second passages of adjacent flow channels so that none overlap, and that no flow channels are bypassed.

The walls 226*a*-226*g* may be positioned, secured, or otherwise attached within the container 210 by any suitable techniques. In one or more embodiments, the walls 226*a*-226*g* are independently welded to inside surfaces of the container.

Gas flow "G" enters a first outer channel 224*a* towards the bottom wall 212 from inlet port 220 and its passage 221. The first outer channel 224*a* is defined by a first inner surface of sidewall 114*s*1 and a surface of the wall 226*a*. Arrow "A" shows the flow through opening 228*a* of the wall 226*a* into inner channel 224*b* towards the lid 216. Arrow "B" shows the flow through opening 228*b* of the wall 226*b* into inner channel 224*c* towards the bottom wall 212. Arrow "C" shows the flow through opening 228*c* of the wall 226*c* into inner channel 224*d* towards the lid 216. Arrow "D" shows the flow through opening 228*d* of the wall 226*d* into inner channel 224*e* towards the bottom wall 212. Arrow "E" shows the flow through opening 228*e* of the wall 226*e* into inner channel 224*f* towards the lid 216. Arrow "F" shows the flow through opening 228*f* of the wall 226*f* into inner channel 224*g* towards the bottom wall 212. Arrow "G" shows the flow through opening 228*g* of the wall 226*g* into a second outer channel 224*h* towards the outlet port 230 and its passage 231. The second outer channel 224*h* is defined by a second inner surface of sidewall 114*s*2 and a surface of the wall 226*g*.

In one or more embodiments, the ampoule comprises a single inlet and a single outlet. While the embodiment of FIG. 3 depicts one of each an inlet and an outlet port, should a particular application require, multiple inlet ports and outlet ports may be present. Positioning of the inlet and outlet ports may be switched to accommodate other designs.

In one or more embodiments, the inlet port 220, the outlet port 230, or both the inlet port 220 and the outlet port 230 extend through the lid 216. In one or more embodiments, the inlet port 220, the outlet port 230, or both the inlet port 220 and the outlet port 230 extend through the side wall 214. In one or more embodiments, the inlet port 120 extends through the lid 216, and the outlet port 230 extends through the sidewall 214. In one or more embodiments, the inlet port 220 extends through the sidewall 214, and the outlet port 230 extends through the lid 216.

In one or more embodiments, the relative location of the baffles may be adjusted as-needed. In one or more embodiments, axial distances between walls varies.

In the flow channels, the carrier gas traveling through the voids space 256 contacts the solid precursor 250 thereby entraining and/or vaporizing the precursor as the carrier gas passes over a surface of a volume of the precursor. While in each of the flow channels, the carrier gas continues to contact the precursor 250 and becomes saturated.

Accordingly, the flow channels 224a-224h comprise a plurality of tortuous passages (224a-224g) and an outlet passage (224h).

According to one or more embodiments, when the ampoule contains a minimum quantity of precursor, which may depend on the specific precursor in the ampoule and its physical properties, it is expected that the carrier gas will become fully saturated over the flow path distance. It is not expected that the degree of saturation decreases as the amount of precursor level in the ampoule decreases during use.

It is understood that the presence of eight flow channels in FIG. 3 is not limiting and that the number of channels may be chosen based on space constraints and/or precursor characteristics and/or design need.

In some embodiments, the gas flow through the inlet port 220 and along the flow path is sufficient to entrain and/or vaporize and/or sublime the precursor without a need for bubbling. The gas flow can be adjusted during processing as the level of precursor 250 decreases to maintain a sufficient contact. The gas flow of some embodiments has a maximum velocity in combination with the heat sources sufficient to prevent condensation of the precursor 250 at the outlet port 230.

Thermocouples, mass flow meters, and pressure gauges may be included in the equipment denoted herein in order to monitor process conditions. In one or more embodiments, a mass flow meter is provided to monitor gas flow into the inlet port. In one or more embodiments, a thermocouple is installed in the lid. In one or more embodiments, a pressure gauge is provided on the inlet line and/or the outlet line. A pressure range within the ampoule in accordance with some embodiments is greater than or equal to 25 torr to less than or equal to 150 torr.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An ampoule for a precursor material for semiconductor manufacturing, the ampoule comprising:
   a container defining a precursor cavity configured to hold the precursor material, the container including a lid having a bottom surface, a bottom wall having a top surface and sidewalls defining the precursor cavity;
   an inlet port and an outlet port, both in fluid communication with the precursor cavity;
   alternating first and second elongate baffles extending from the bottom surface of the lid to the top surface of the bottom wall and arranged to define a series of longitudinal flow channels containing the precursor material, and alternating first and second passages between each of the longitudinal flow channels permitting fluid communication between adjacent longitudinal flow channels, wherein the first passages include one or more openings located in a lower portion of the first elongate baffles and the second passages are one or more openings located in an upper portion of the second elongate baffles and the first passages and the second passages are offset from each other;
   a flow path defined by the longitudinal flow channels and the first passages and the second passages, through which a carrier gas flows in contact with the precursor material; and
   seals selected from o-rings and gaskets, the seals providing fluid tight separation between the first set of elongate baffles and the second set of elongate baffles, forcing flow through the first passages and the second passages, and the bottom surface of the lid is in contact with the sidewalls of the container.

2. The ampoule of claim 1, wherein the lid is a separate component from the bottom wall and the sidewalls.

3. The ampoule of claim 1, wherein the flow path is tortuous.

4. The ampoule of claim 1, wherein the seals are at a bottom edge and a top edge of the first elongate baffles and the second elongate baffles.

5. The ampoule of claim 1 comprising a range of one to ten of the first elongate baffles, and a range of one to ten of the second elongate baffles.

6. The ampoule of claim 1, wherein a solid precursor in the form of granules or pellets and defining void space between the granules or pellets is disposed within the precursor cavity to provide a precursor level.

7. The ampoule of claim 6, wherein the ampoule comprises a single inlet and a single outlet, the single inlet above the precursor level.

8. The ampoule of claim 1, wherein each of the first elongate baffles comprise a total of one to ten openings, and each of the second elongate baffles independently comprise a total of one to ten openings.

9. An ampoule for dispensing a vapor mixture of a carrier gas and a precursor material used in semiconductor manufacturing, the ampoule comprising:

a container having a bottom wall having a top surface, sidewalls, and a lid having a bottom surface, the container defining a precursor cavity configured to hold a solid precursor, such that a height (H) of the precursor cavity spans from the bottom surface of the lid to the top surface of the bottom wall;

a single inlet port and a single outlet port, both in fluid communication with the precursor cavity;

alternating first and second elongate baffles spanning from the top surface of the bottom wall to the bottom surface of the lid and arranged to define a series of longitudinal flow channels containing the precursor material, and alternating first and second passages between each of the longitudinal flow channels permitting fluid communication between adjacent longitudinal flow channels, wherein the first passages are openings located in a lower portion of the first elongate baffles, and the second passages are openings located in an upper portion of the second elongate baffles, and the first passages are offset from the second passages;

seals selected from o-rings and gaskets, the seals providing fluid tight separation between the first set of elongate baffles and the second set of elongate baffles, forcing flow through the first passages and the second passages, and the bottom surface of the lid is in contact with the sidewalls of the container; and a tortuous flow path defined by the longitudinal flow channels and the first passages and the second passages, through which a carrier gas flows in contact with the precursor material.

10. The ampoule of claim 9, wherein the lid is a separate component from the bottom wall and the sidewalls.

11. The ampoule of claim 9 comprising a range of one to ten of the first elongate baffles, and a range of one to ten of the second elongate baffles.

12. The ampoule of claim 9, wherein each of the first elongate baffles comprise a total of one to ten openings, and each of the second elongate baffles independently comprise a total of one to ten openings.

13. The ampoule of claim 9, wherein the precursor material is a solid precursor in the form of granules or pellets and defining void space between the granules or pellets and wherein a length of the tortuous flow path is effective for saturation of the carrier gas by the solid precursor material.

\* \* \* \* \*